United States Patent
Hirota

(10) Patent No.: US 8,225,149 B2
(45) Date of Patent: Jul. 17, 2012

(54) SEMICONDUCTOR TESTING APPARATUS AND METHOD

(75) Inventor: Akihiro Hirota, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 0 days.

(21) Appl. No.: 13/081,189

(22) Filed: Apr. 6, 2011

(65) Prior Publication Data

US 2011/0185239 A1   Jul. 28, 2011

Related U.S. Application Data

(63) Continuation of application No. 12/196,420, filed on Aug. 22, 2008.

(30) Foreign Application Priority Data

Sep. 28, 2007   (JP) .................................. 2007-254362

(51) Int. Cl.
*G11C 29/00* (2006.01)
(52) U.S. Cl. ....................................... 714/718; 714/721
(58) Field of Classification Search .................... None
See application file for complete search history.

(56) References Cited

U.S. PATENT DOCUMENTS

| | | | |
|---|---|---|---|
| 6,034,903 A | 3/2000 | Ichikawa | |
| 6,434,068 B1 * | 8/2002 | Harada et al. | 365/201 |
| 2002/0010884 A1 * | 1/2002 | Yamazaki | 714/718 |
| 2004/0228198 A1 * | 11/2004 | Shimizu | 365/232 |
| 2005/0105326 A1 * | 5/2005 | Hanzawa et al. | 365/154 |
| 2006/0034142 A1 | 2/2006 | Ooishi et al. | |
| 2006/0083070 A1 * | 4/2006 | Arakawa | 365/185.21 |
| 2007/0226560 A1 | 9/2007 | Uchida | |
| 2008/0059849 A1 * | 3/2008 | Ito | 714/718 |

FOREIGN PATENT DOCUMENTS

JP   08-023016   1/1996

OTHER PUBLICATIONS

P. Girard et al.; "A Test Vector Ordering Technique for Switching Activity Reduction during Test Operation"; Aug. 6, 2002.

* cited by examiner

*Primary Examiner* — Guerrier Merant
(74) *Attorney, Agent, or Firm* — Studebaker & Brackett PC; Donald R. Studebaker

(57) ABSTRACT

The present invention provides a semiconductor testing apparatus and method capable of reliably determining whether a semiconductor memory is good or bad. A "1" reading test of each cell corresponding to one bit at a first step is first performed on a memory cell array. "0" writing of each cell corresponding to one bit at a second step and a "0" reading test of each cell corresponding to one bit at a third step are executed on the memory cell array. Thus, the time taken from the supply of power to the start of the "0" reading test of the reference cell at the third step can be significantly shortened. As a result, a defect of a reference bit line due to a breaking or high resistance of a gate of a reference column switch transistor corresponding to a normally ON transistor can be screened.

8 Claims, 8 Drawing Sheets

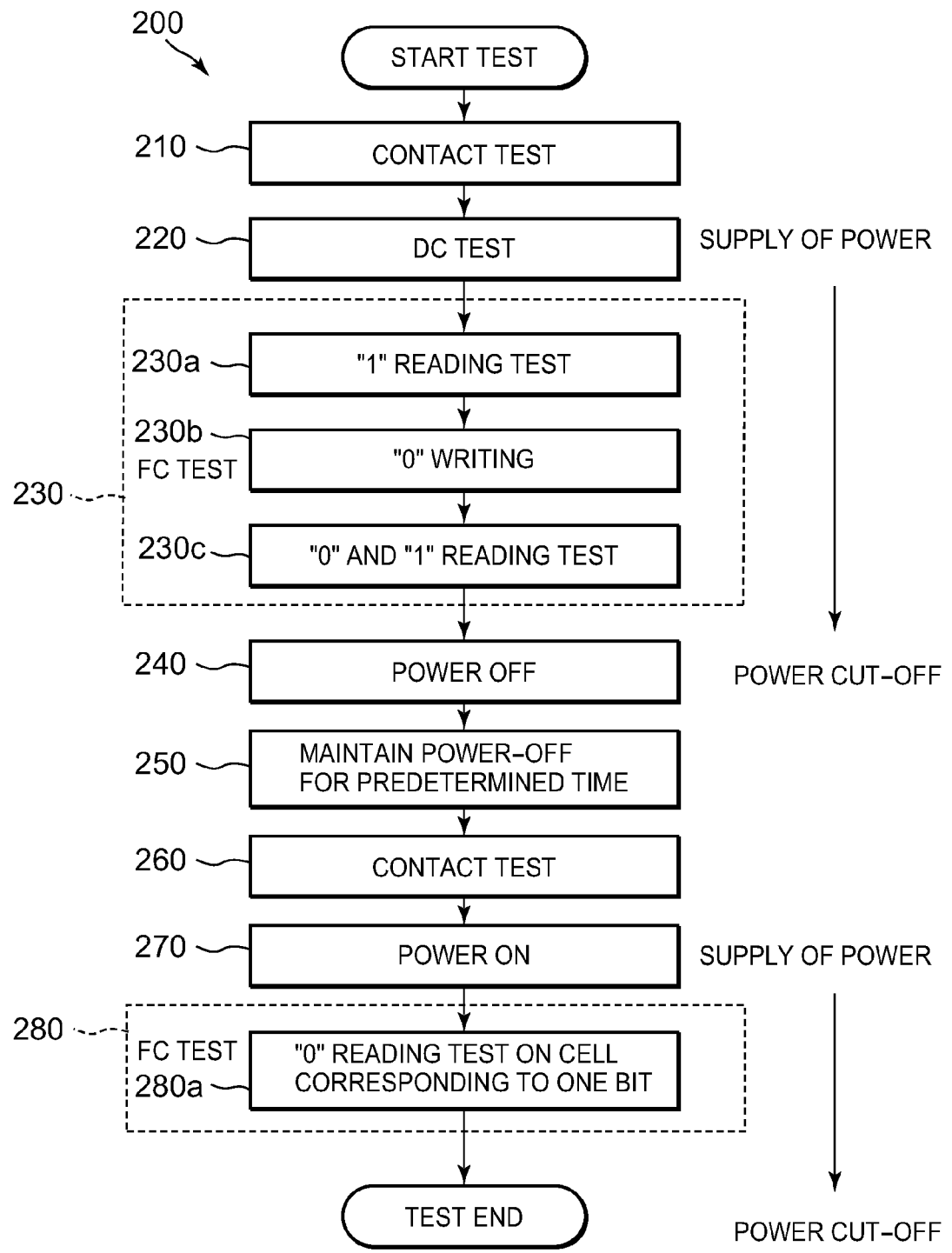

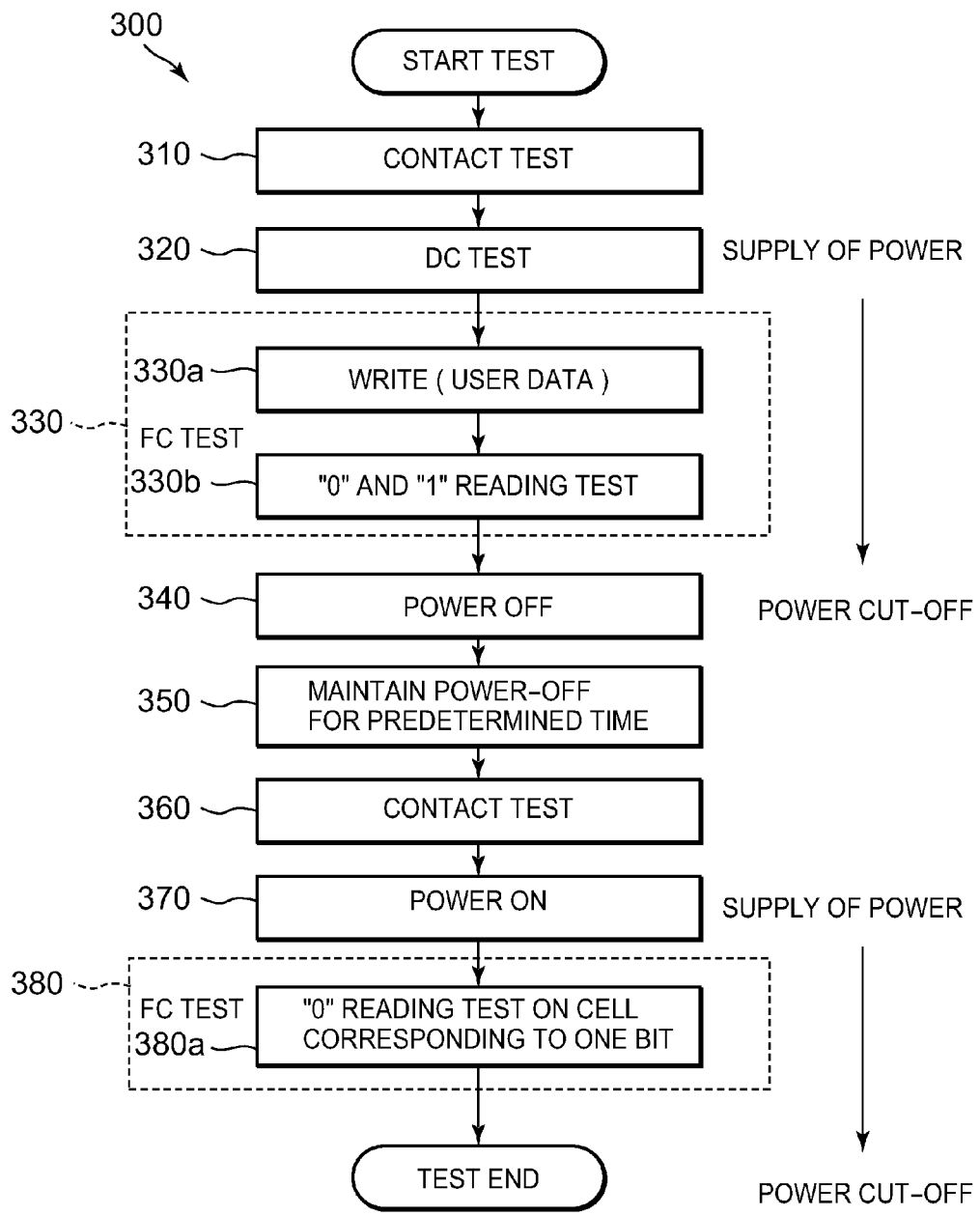

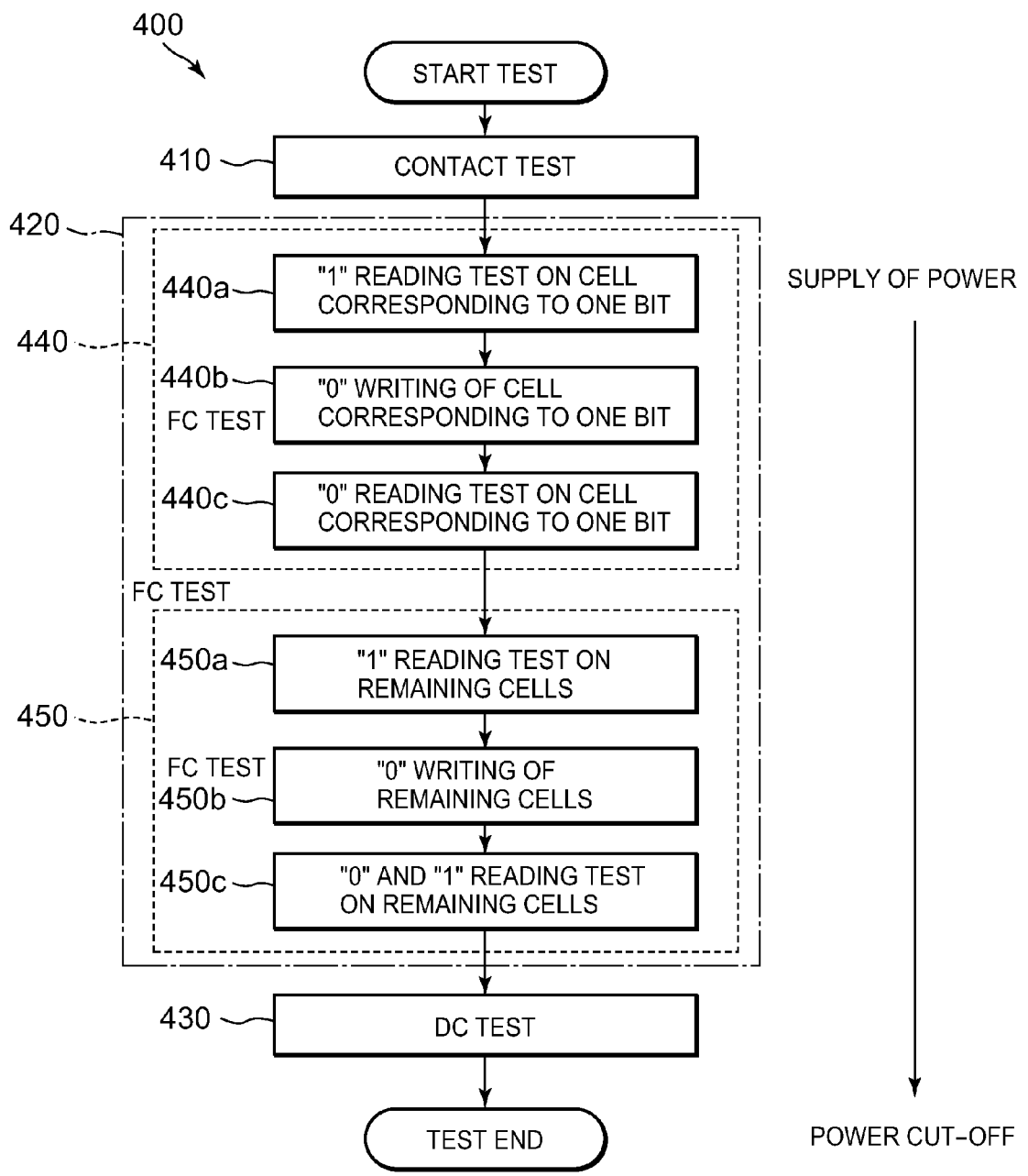

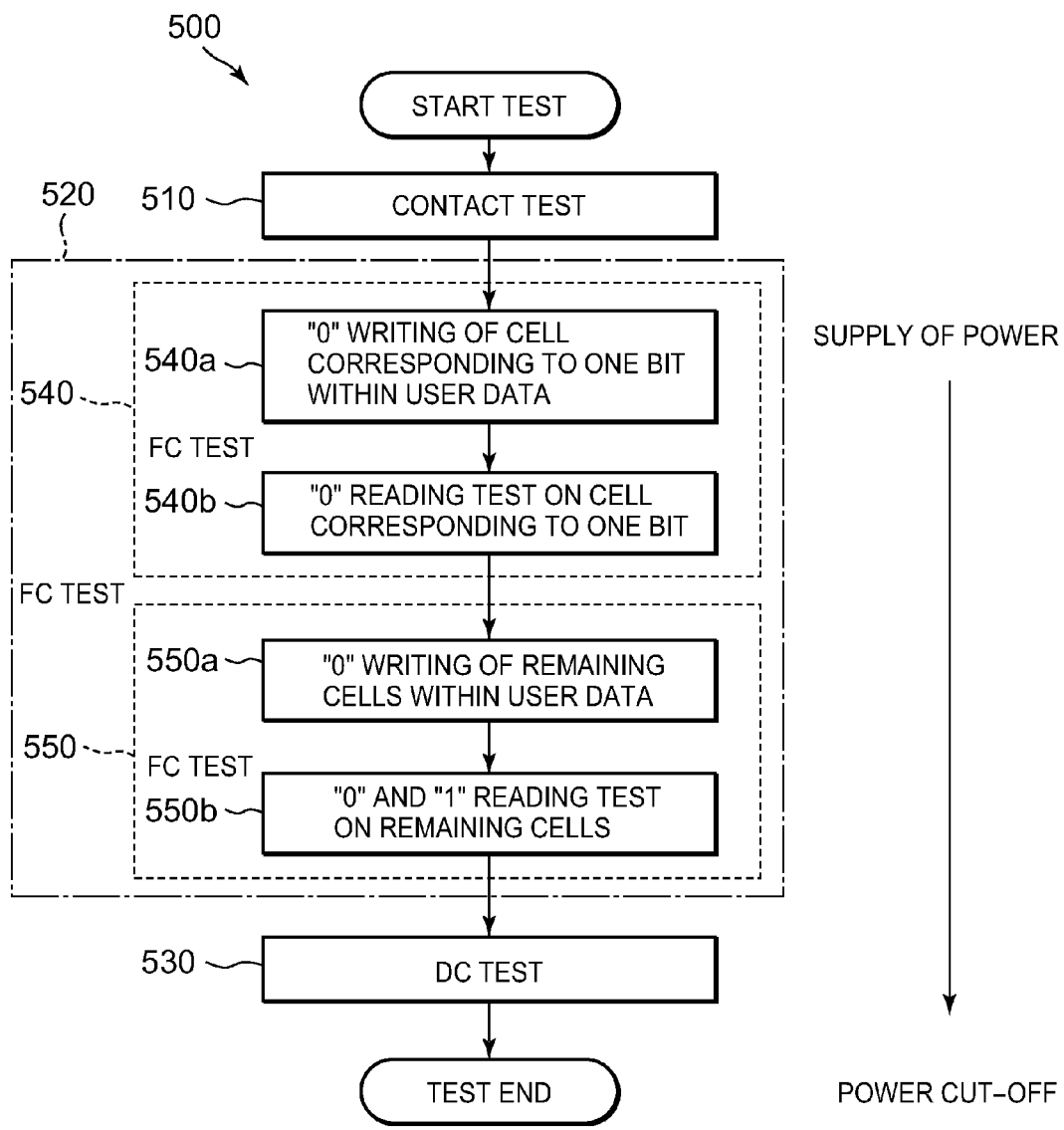

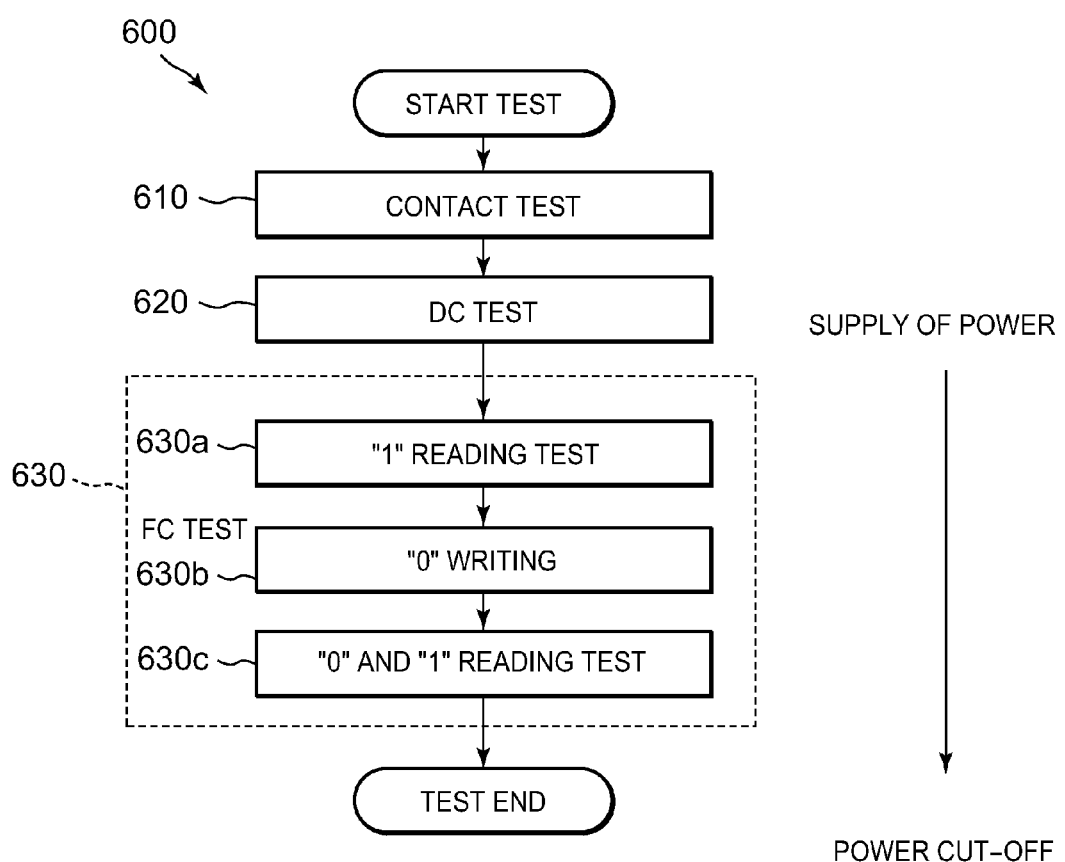

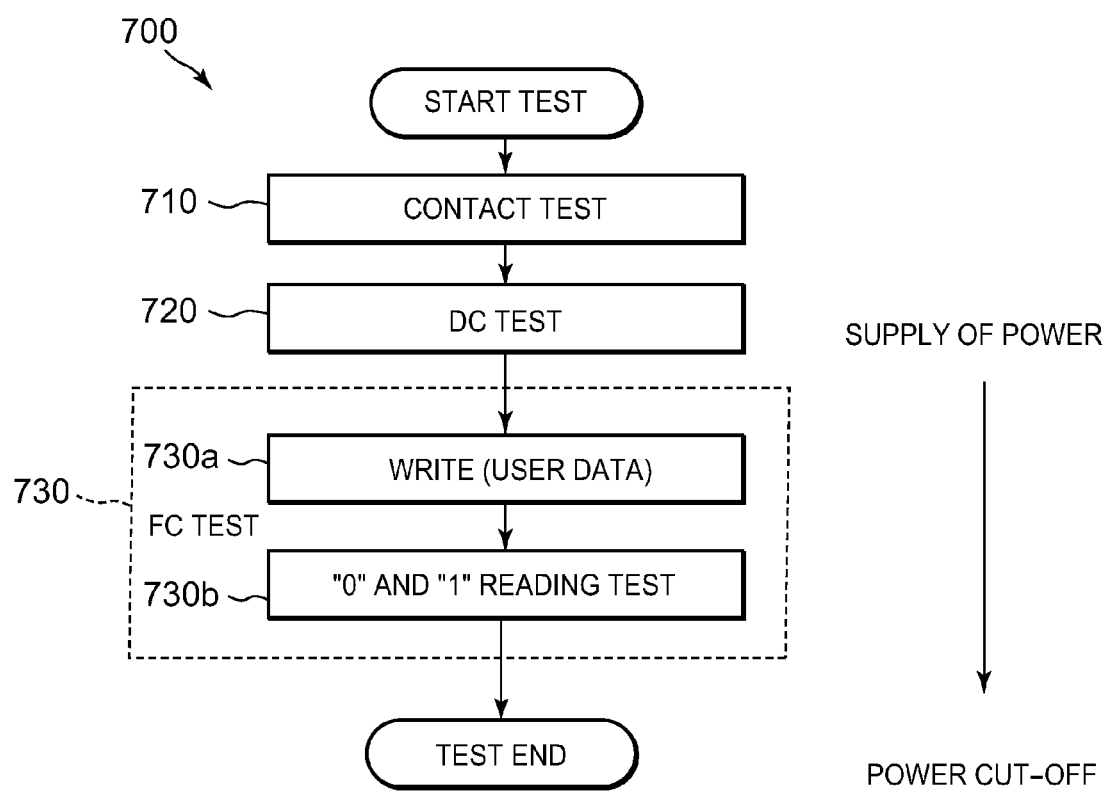

NO CURRENT FLOWS

CURRENT FLOWS

SEMICONDUCTOR TESTING APPARATUS AND METHOD

BACKGROUND OF THE INVENTION

The present invention relates to a semiconductor testing or inspecting apparatus and method, and particularly to screening of a non-volatile semiconductor memory.

In a conventional method of testing a semiconductor memory, a result of a pretest in a laser repair process for, when a defective memory cell exists in a memory array, substituting a spare memory array therefor by blowing a fuse provided within the semiconductor memory is stored in the semiconductor memory. In a wafer test corresponding to a subsequent process, the test result stored in the memory is read and unnecessary tests are omitted. There has been proposed such a configuration that as semiconductor memory test processes at this time, a contact test, a DC test (Direct Current Test) and an FC test (FunCtion test) are performed in order and thereby a decision as to whether the semiconductor memory is good or bad is made (refer to a patent document 1 (Japanese Unexamined Patent Publication No. Hei 08(1996)-023016)).

In the process of testing the semiconductor memory such as described in the patent document 1, however, it is not always possible to accurately determine whether the semiconductor memory is good or bad.

SUMMARY OF THE INVENTION

The invention of the present application has been made with the foregoing in view. It is an object of the present invention to obtain a semiconductor inspecting or testing apparatus and method capable of reliably determining whether a semiconductor memory is good or bad.

According to one aspect of the invention, for attaining the above object, there is provided a semiconductor testing apparatus for mounting a device having a plurality of normal cells each having a memory function for accumulating an electric charge by a floating gate thereof and a control gate thereof thereby to store information, and at least one reference cell identical in structure and function to each of the normal cells and taken as a reference object for an operating state of the normal cell, to a mounting portion as an object to be tested thereby to supply power to the device and testing an operating state of the device, comprising function test execution unit for operating each of the normal cells as an object on a pseudo basis to perform a function test on the corresponding cell with the reference cell as a reference, and power supply control unit for controlling the supply of power in such a manner that after the completion of execution of the function test execution unit, the supply thereof from the mounting portion to the device is stopped and the power is supplied again after a predetermined time, wherein the function test execution unit performs at least one the function test, based on the function test execution unit after the resupply of power by the power supply control unit thereby to determine whether the operation of the reference cell is good.

According to another aspect of the invention, for attaining the above object, there is provided a semiconductor testing apparatus for mounting a device having a plurality of normal cells each including a memory function for accumulating an electric charge by a floating gate thereof and a control gate thereof thereby to store information, and at least one reference cell identical in structure and function to each of the normal cells and taken as a reference object for an operating state of the normal cell, to a mounting portion as an object to be tested thereby to supply power to the device and testing an operating state of the device, comprising contact test execution unit for performing a contact test for determining electrical conduction between the mounting portion and pads or terminals of the device on all of the pads or terminals, dc test execution unit for performing a dc test for inspecting a state of a direct current characteristic at an input/output of the device on all the cells, function test execution unit for operating each of the normal cells as an object on a pseudo basis to perform a function test on the corresponding cell with the reference cell as a reference, and power supply control unit for controlling the supply of power in such a manner that after the completion of execution of the contact test execution unit, the dc test execution unit and the function test execution unit, the supply thereof from the mounting portion to the device is stopped and the power is supplied again after a predetermined time, wherein the function test execution unit performs at least one the function test, based on the function test execution unit after the resupply of power by the power supply control unit thereby to determine whether the operation of the reference cell is good.

According to a further aspect of the invention, there is provided a semiconductor testing apparatus wherein in the semiconductor testing apparatus according to the first or second aspect, the normal cells are classified into plural sets and one the reference cell is provided for each set, and the function test execution unit performs a function test on the corresponding cell for every set.

According to a further aspect of the invention, there is provided a semiconductor testing apparatus wherein in the semiconductor testing apparatus according to the second or third aspect, the contact test execution unit is executed after the elapse of the predetermined time and before the resupply of the power.

According to a further aspect of the invention, for attaining the above object, there is provided a semiconductor testing apparatus for mounting a device having a plurality of normal cells each having a memory function for accumulating an electric charge by a floating gate thereof and a control gate thereof thereby to store information, and at least one reference cell identical in structure and function to each of the normal cells and taken as a reference object for an operating state of the normal cell, to a mounting portion as an object to be tested thereby to supply power to the device and testing an operating state of the device, comprising function test execution unit for operating each of the normal cells as an object on a pseudo basis to perform a function test on the corresponding cell with the reference cell as a reference, wherein the function test execution unit preferentially performs a decision as to whether the operation of the reference cell is good, by conducting at least one the function test.

According to a further aspect of the invention, for attaining the above object, there is provided a semiconductor testing apparatus for mounting a device having a plurality of normal cells each having a memory function for accumulating an electric charge by a floating gate thereof and a control gate thereof thereby to store information, and at least one reference cell identical in structure and function to each of the normal cells and taken as a reference object for an operating state of the normal cell, to a mounting portion as an object to be tested thereby to supply power to the device and testing an operating state of the device, comprising contact test execution unit for performing a contact test for determining electrical conduction between the mounting portion and pads or terminals of the device on all of the pads or terminals, function test execution unit for operating each of the normal cells as an object on a pseudo basis after the supply of the power thereby to preferentially execute a decision as to whether the operation of the reference cell is good, by conducting at least one the function test based on a function test on the corresponding cell with the reference cell as a reference and operating each of the normal cells other that the normal cells with the function test conducted thereon, as an object on a pseudo basis thereby to perform a function test on the corresponding cell with the reference cell as a reference, and dc test execution unit for performing a dc test for inspecting a state of a direct current characteristic at an input/output of the device on all the cells.

According to a further aspect of the invention, for attaining the above object, there is provided a semiconductor testing apparatus for mounting a device having a plurality of normal cells each including a memory function for accumulating an electric charge by a floating gate thereof and a control gate thereof thereby to store information, and at least one reference cell identical in structure and function to each of the normal cells and taken as a reference object for an operating state of the normal cell, to a mounting portion as an object to be tested thereby to supply power to the device and testing an operating state of the device, comprising contact test execution unit for performing a contact test for determining electrical conduction between the mounting portion and pads or terminals of the device on all of the pads or terminals, function test execution unit for supplying the power after execution of the contact test execution unit, operating each of the normal cells as an object on a pseudo basis thereby to determine whether the operation of the reference cell is good, by conducting at least one function test based on the function test on the corresponding cell with the reference cell as a reference and performing the function test on all the remaining normal cells as objects, and dc test execution unit for performing a dc test for inspecting a state of a direct current characteristic at an input/output of the device on all the cells after execution of the function test execution unit.

According to a further aspect of the invention, there is provided a semiconductor testing apparatus wherein in the semiconductor testing apparatus according to the sixth or seventh aspect, the normal cells are classified into plural sets and one the reference cell is provided for each set, and the function test execution unit performs a function test on the corresponding cell for every set.

According to a further aspect of the invention, for attaining the above object, there is provided a semiconductor testing method for mounting a device having a plurality of normal cells each having a memory function for accumulating an electric charge by a floating gate thereof and a control gate thereof thereby to store information, and at least one reference cell identical in structure and function to each of the normal cells and taken as a reference object for an operating state of the normal cell, to a mounting portion as an object to be examined thereby to supply power to the device and testing an operating state of the device, comprising the steps: a function test executing step for operating each of the normal cells as an object on a pseudo basis to perform a function test on the corresponding cell with the reference cell as a reference, a power supply control step for controlling the supply of power in such a manner that after the completion of execution of the function test executing step, the supply thereof from the mounting portion to the device is stopped and the power is supplied again after a predetermined time, and a determining step for performing at least one the function test, based on the function test execution step after the resupply of power by the power supply control step thereby to determine whether the operation of the reference cell is good.

According to a further aspect of the invention, for attaining the above object, there is provided a semiconductor testing method for mounting a device having a plurality of normal cells each having a memory function for accumulating an electric charge by a floating gate thereof and a control gate thereof thereby to store information, and at least one reference cell identical in structure and function to each of the normal cells and taken as a reference object for an operating state of the normal cell, to a mounting portion as an object to be tested thereby to supply power to the device and testing an operating state of the device, comprising the steps: a contact test executing step for performing a contact test for determining electrical conduction between the mounting portion and pads or terminals of the device on all of the pads or terminals, a dc test executing step for performing a dc test for inspecting a state of a direct current characteristic at an input/output of the device on all the cells, a function test executing step for operating each of the normal cells as an object on a pseudo basis to perform a function test on the corresponding cell with the reference cell as a reference, a power supply control step for controlling the supply of power in such a manner that after the completion of execution of the contact test executing step, the dc test executing step and the function test executing step, the supply thereof from the mounting portion to the device is stopped and the power is supplied again after a predetermined time, and a determining step for performing at least one the function test, based on the function test execution step after the resupply of power by the power supply control step thereby to determine whether the operation of the reference cell is good.

According to a further aspect of the invention, for attaining the above object, there is provided a semiconductor testing method for mounting a device having a plurality of normal cells each having a memory function for accumulating an electric charge by a floating gate thereof and a control gate thereof thereby to store information, and at least one reference cell identical in structure and function to each of the normal cells and taken as a reference object for an operating state of the normal cell, to a mounting portion as an object to be tested thereby to supply power to the device and testing an operating state of the device, comprising the steps: a function test executing step for operating each of the normal cells as an object on a pseudo basis to perform a function test on the corresponding cell with the reference cell as a reference, and a decision priority executing step for preferentially performing a decision as to whether the operation of the reference cell is good, by conducting at least one the function test, based on the function test executing step.

According to a further aspect of the invention, for attaining the above object, there is provided a semiconductor testing method for mounting a device having a plurality of normal cells each including a memory function for accumulating an electric charge by a floating gate thereof and a control gate thereof thereby to store information, and at least one reference cell identical in structure and function to each of the normal cells and taken as a reference object for an operating state of the normal cell, to a mounting portion as an object to be tested thereby to supply power to the device and testing an operating state of the device, comprising the steps: a contact test executing step for performing a contact test for determining electrical conduction between the mounting portion and pads or terminals of the device on all of the pads or terminals, a decision priority executing step for operating each of the normal cells as an object on a pseudo basis after the supply of the power thereby to preferentially execute a decision as to whether the operation of the reference cell is good, by conducting at least one the function test based on a function test on the corresponding cell with the reference cell as a reference, a function test executing step for operating each of the normal cells other than the normal cells subjected to the function test by the decision priority executing step on a pseudo basis as an object to perform a function test on the corresponding cell with the reference cell as a reference, and a dc test executing step for performing a dc test for inspecting a state of a direct current characteristic at an input/output of the device on all the cells.

According to a further aspect of the invention, for attaining the above object, there is provided a semiconductor testing method for mounting a device having a plurality of normal cells each having a memory function for accumulating an electric charge by a floating gate thereof and a control gate thereof thereby to store information, and at least one reference cell identical in structure and function to each of the normal cells and taken as a reference object for an operating state of the normal cell, to a mounting portion as an object to be tested thereby to supply power to the device and testing an operating state of the device, comprising the steps: a contact test executing step for performing a contact test for determining electrical conduction between the mounting portion and pads or terminals of the device on all the pads or terminals, a decision executing step for supplying the power after execution of the contact test executing step and operating each of the normal cells as an object on a pseudo basis thereby to determine whether the operation of the reference cell is good, by conducting at least one function test based on the function test on the corresponding cell with the reference cell as a reference, a function test executing step for performing the function test on all the remaining normal cells as objects after execution of the decision executing step, and a dc test executing step for performing a dc test for inspecting a state of a direct current characteristic at an input/output of the device on all the cells after execution of the function test executing step.

According to the invention of the present application as described above, an advantageous effect is brought about in that it is possible to reliably determine whether a semiconductor memory is good or bad.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 2 is a first flowchart for inspecting a wafer level OTP according to the first preferred embodiment of the invention of the present application;

FIG. 3 is a second flowchart for inspecting the packaged OTP according to the first preferred embodiment of the invention of the present application;

FIG. 4 is a third flowchart for inspecting a wafer level OTP according to a second preferred embodiment of the invention of the present application;

FIG. 5 is a fourth flowchart for inspecting the packaged OTP according to the second preferred embodiment of the invention of the present application;

FIG. 6 shows a wafer level test process according to a prior art;

FIG. 7 shows a packaged test process according to the prior art; and

DETAILED DESCRIPTION OF THE PREFERRED EMBODIMENTS

Preferred embodiments of the present invention will hereinafter be described with reference to the accompanying drawings.

First Preferred Embodiment

Figure 1:
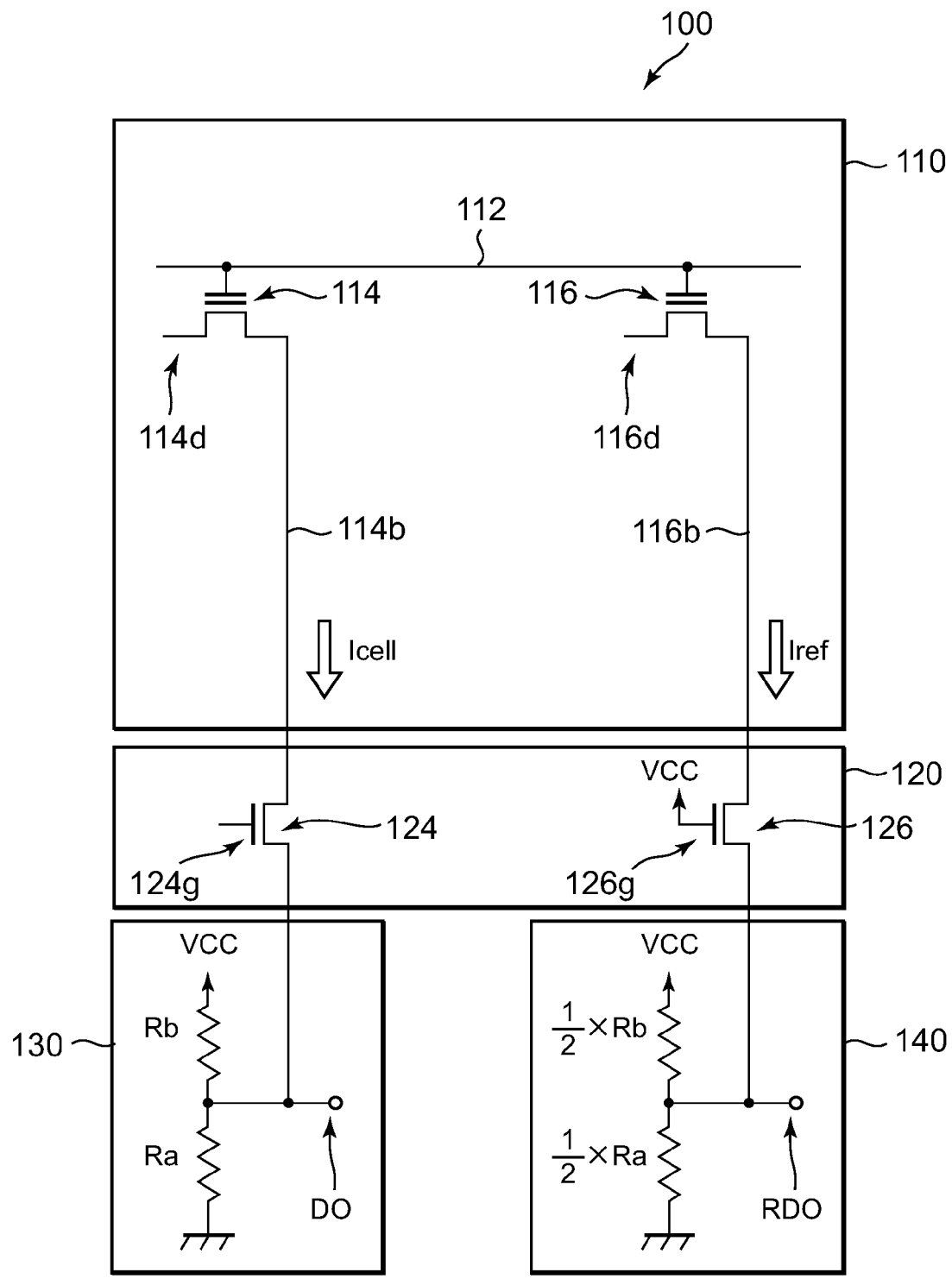
FIG. 1 is a configuration diagram of a non-volatile semiconductor memory showing a device according to a first preferred embodiment of the invention of the present application.

FIG. 1 is a configuration diagram of a non-volatile semiconductor memory 100 showing a device according to a first preferred embodiment of the invention of the present application.

The non-volatile semiconductor memory 100 corresponding to the device is also called "one time PROM (One Time Programmable Read Only Memory), which is hereinafter referred to as "OTP 100".

The OTP 100 is equivalent to one in which an ultra violet-erasable PROM (UV-EPROM: Ultra Violet-Erasable Programmable Read Only Memory, which is hereinafter called "EPROM") is encapsulated (resin-sealed) in a plastic package with no ultraviolet penetration. In the OTP 100, the number of writings is limited to once because the contents stored cannot be erased by ultraviolet irradiation as in the EPROM. However, the OTP 100 is very lower in cost than other EPROMs owing to the use of the plastic package therein.

Incidentally, while the non-volatile semiconductor memory 100 is explained as the OTP 100, it may be an EEPROM (Electric Erasable Programmable Read Only Memory) or a flash memory. In the EPROM, all data are batch-erased using an EPROM eraser and data is written again by a PROM writer. In the EEPROM, however, an arbitrary one bit is designated using word and bit lines and data is erased and written electrically. Although the erasure of data can be conducted only in block units of predetermined bytes or the like in the flash memory, the writing thereof is enabled in a one-bit unit.

The OTP 100 comprises a memory cell array 110, a column switch group 120, a detector 130 and a reference detector 140.

The memory cell array 110 is connected to the column switch group 120. The column switch group 120 is connected to the detector 130 and the reference detector 140.

The memory cell array 110 comprises a selection word line (hereinafter called "selection WL") 112, a normal cell transistor 114 and a reference cell transistor 116. Incidentally, the normal cell transistor 114 and the reference cell transistor 116 respectively have a memory function for accumulating electric charges therein by floating and control gates thereby to store information and have the same structure and function.

The control gates of the reference cell transistor 116 and the normal cell transistor 114 are connected to the selection WL 112 and shared therefor. Incidentally, there is a case where one reference cell transistor 116 is connected to the selection WL 112, and there is also a case where a plurality of the reference cell transistors 116 are connected thereto. Normally, a plurality of the normal cell transistors 114 are connected to the selection WL 112. Further, a plurality of the selection WLs 112 exist in the memory cell array 110. The capacity of the memory cell array 110 is determined depending on the number of the selection WLs 112 and the amount of the normal cell transistors 114 respectively connected to the selection WLs 112.

A cell drain 114d is connected to one end of the normal cell transistor 114 and supplied with a drain voltage. Even in the case of the reference cell transistor 116 in a manner similar to the normal cell transistor 114, a cell drain 116d is connected to one end of the reference cell transistor 116 and supplied with a drain voltage.

Further, a bit line 114b is connected to the other end of the normal cell transistor and a normal cell current Icell flows therethrough. Even in the reference cell transistor 116, a reference bit line 116b is connected to the other end of the reference cell transistor 116 and a reference cell current Iref flows therethrough.

Furthermore, the bit line 114b is connected between division resistors Ra and Rb of the detector 130 (connected to a detector output DO) via a column switch transistor 124 of the column switch group 120. The bit line 116b is connected between division resistors Ra/2 and Rb/2 of the reference detector 140 (connected to a reference detector output RDO) via a column switch transistor 126 of the column switch group 120.

A read operation of the OTP 100 will be explained with reference to FIG. 1.

FIG. 1 shows a simplified one of a circuit diagram at the reading of the OTP 100.

One normal cell transistor 114 lying within the memory cell array 110 is supplied with a drain voltage from its cell drain 114d. The reference cell transistor 116 is supplied with a drain voltage from its cell drain 116d.

When the selection WL 112 rises and the column switch transistor 124 connected to the bit line 114b within the column switch group 120 is selected by a column address (the voltage is applied to a gate 124g) upon the selection of the normal cell transistor 114, a normal cell current Icell flows from the cell drain 114d to the detector 130 via the bit line 114b. For example, when the selection WL 112 rises, a voltage of 3.6V is applied to the selection WL 112 and a voltage of 1.0V is applied to the cell drain 114d, so that the normal cell current Icell flows into the detector 130 via the bit line 114b.

The detector 130 is simplified by such an equivalent circuit as shown in FIG. 1. The voltage of the detector output DO can be expressed in terms of Ra (VCC/(Ra+Rb)+Icell).

On the other hand, when the selection WL 112 rises even in the reference cell transistor 116, a reference cell current Iref flows into the reference detector 140 through the reference bit line 116b. At this time, the gate 126g of the reference column switch transistor 126 connected to the reference bit line 116b is connected to a source or power supply VCC. Hence, the reference cell transistor 116 allows the reference current Iref to flow without depending on the column address.

For example, the normal voltage VCC is of 3.3V (for example, standard: 3.3V±0.3V). 3.3V of the normal voltage VCC is applied to the gates 124g and 126g of the column switch transistor 124 and reference column switch transistor 126 respectively so that they are respectively brought to an ON state (active state). Incidentally, the gate 126g of the reference column switch transistor 126 is in a normally ON state and always supplied with the voltage of 3.3V.

The connection of the gate 126g of the reference column switch transistor 126 to the power supply VCC is made to compare the reference cell current Iref that flows from the reference cell transistor 116 and the normal cell current Icell that flows from the normal cell transistor 114. Therefore, there is a need to cause the current to flow at all times without depending on the column address. This is also made because there is a need to make the above connection via the reference column switch transistor 126 in such a manner that no difference occurs between a current path of the normal cell transistor 114 and a current path of the reference cell transistor 116.

While the reference cell current Iref also flows into the reference detector 140 in a manner similar to the normal cell current Icell, the inter-source resistance becomes ½ in the reference detector 140 as compared with the detector 130, and the reference detector output RDO is brought to Ra (VCC/(Ra+Rb)+Iref/2).

"0" and "1" are determined by making a comparison between the reference detector output RDO and the detector output DO, based on the electric charge accumulated in the normal cell transistor 114 of the OTP 100.

When the normal cell transistor 114 is "0" (in a write state), the threshold voltage Vt of the normal cell transistor 114 is higher than the voltage level of the selection WL 112 and no normal cell current Icell flows. At this time, DO−RDO=−Ra (Iref/2). Incidentally, when data "0" is recorded in the write state, a high voltage is applied to the drain and gate of the normal cell transistor 114 so that thermoelectrons are injected into its floating gate. When the data "0" is read in a read state, the normal cell transistor 114 is not turned ON by hindrance to its turning-ON due to the electrons lying in the floating gate even though the voltage is applied to the gate of the normal cell transistor 114, so that no current flows between the drain and source thereof.

When the normal cell transistor 114 is "1" (in a blank state), the threshold voltage Vt of the normal cell transistor 114 is lower than the voltage level of the selection WL 112 and the normal cell current Icell flows. Incidentally, when data is brought to "1" in the blank state, electrons are being emitted into the floating gate of the normal cell transistor 114. In the case of the UV-EPROM, for example, the electrons confined within the floating gate by ultraviolet irradiation are emitted so that data is erased (brought to "1"). Similarly, data is electrically erased (brought to "1") even in the case of the EEPROM. When the voltage is applied to the gate of the normal cell transistor 114 where the data "1" is read in the read state, the corresponding transistor is turned ON so that current flows between the drain and source thereof.

Thus, since, at this time, the threshold voltages Vt of the normal cell transistor 114 and the reference cell transistor 116 are equal to each other and Icell=Iref, DO−RDO=Ra(Iref/2) is reached.

Meanwhile, FIG. 6 shows a wafer level test process 600 in a prior art. Incidentally, the test process 600 of FIG. 6 indicates where a wafer level OTP 100 is tested using a probe card.

The test process for the OTP 100 is broadly divided into three process steps corresponding to a contact test of Step 610, a DC test of Step 620 and an FC test (function test) of Step 630. The FC test of Step 630 further consists of three process steps: a "1" reading test of Step 630a, "0" writing of Step 630b and a "0" and "1" reading test of Step 630c.

The contact test unit a test on contact and conducts a test of whether each of pads (or terminals) of a DUT (Device Under Test) corresponding to an actual device such as the OTP 100 and an inspection terminal of semiconductor testing equipment or apparatus (hereinafter called "LSI tester") are in contact with each other. Described in detail, a test on the contact between the pad and the inspection terminal of the LSI tester is conducted on a contact test on a wafer. In the case of a contact test on an IC (Integrated Circuit) brought into a package such as a plastic package or a ceramic package, a test on the contact between each terminal of the IC and the inspection terminal of the LSI tester is conducted. Further, a DUT equipped with a normal cell and a reference cell that becomes a basic target for the normal cell is mounted to a mounting portion (via a probe card or an inspecting board) of the LSI tester as a target to be inspected or examined thereby to perform its test. Incidentally, when such an NC (Non Connect) terminal that each terminal of the IC is not connected to its corresponding pad lying inside a chip exists, a contact test on the NC terminal is not conducted.

The DC test corresponding to a direct current test for testing the state of a DC characteristic at the input/output of the device is also called "DC parametric test" and measures the DC characteristic. The DC test includes, for example, an input leak test, an output leak test, a source current test, a quiescent source current test, an input current test and an output current test or the like.

The function test (hereinafter called "FC test") unit that each cell to be examined of the OTP 100 (device) is operated on a pseudo basis to conduct a function test on the cell (perform a function test under actual operating conditions). Described in detail, the FC test indicates a function test or an actual operation test. On the FC test, a function test on an actual operation for each circuit block (or over the entire integrated circuit) mounted to an IC or LSI (Large Scale Integrated Circuit) or the like is carried out.

Since UV (Ultra-Violet) irradiation is required to return "0" (write state) to "1" (blank state) in the OTP 100, the "1" reading test of Step 630a is generally executed and thereafter the "0" writing of Step 630b is executed. Finally, the "0" and "1" reading test of Step 630c is executed. Incidentally, data about fixed patterns (corresponding to predetermined pattern data and hereinafter called fixed pattern data) are used as the data of "0" and "1" here.

Described in detail, since the initial state is of the blank state, the "1" reading test of Step 630a is first carried out upon inspection of the blank state (because there is a case where when the device is defective, the initial state does not reach "1" indicative of the blank state). Next, the "0" writing at the fixed pattern data, of Step 630b is executed. The "0" and "1" reading test of Step 630c is finally carried out. Since there is a case in which at Step 630b, the "0" of the fixed pattern data is not written properly or the "1" of the fixed pattern data is erroneously reprogrammed or rewritten into "0", the "0" and "1" reading test of Step 630c is carried out. Since the FC test of Step 630 is long in test time, the contact test of Step 610 shorter in test time, and the DC test of Step 620 are executed before the FC test of Step 630.

The OTP 100 brought to a packaged state will be described with reference to FIG. 7. FIG. 7 shows a packaged test process 700 in a prior art. Incidentally, the OTP 100 placed in the packaged state (only one-time writable or programmable EPROM) is not capable of erasing stored data using UV irradiation.

At a contact test of Step 710, a test similar to the contact test of Step 610 in FIG. 6 is carried out. On a DC test of Step 720, a test similar to the DC test of Step 620 in FIG. 6 is performed.

An FC test of Step 730 is basically of a test similar to the FC test of Step 630 in FIG. 6. Unlike the FC test of Step 640 in FIG. 6, however, the process of writing specific user data prepared in advance into a plurality of normal cells contained in the OTP 100 without using the fixed pattern data at the writing of Step 730a is executed. At a "0" and "1" reading test of Step 730b, "0" and "1" of written used data are read to make a decision as to whether the user data are being written properly.

At the above test process, however, the following defects that depend on the time from the supply of power to the start of testing cannot be screened.

Power supply timings in the test processes of the OTP 100 are also shown in FIGS. 6 and 7. The power is turned ON continuously subsequent to the DC tests of Steps 620 and 720. Alternatively, even though the power is turned OFF once after testing, the power is turned ON immediately again to execute the next test. From this regard, the time during which the power is being ON from before test execution, becomes long on the FC tests of Steps 630 and 730.

FIG. 8 shows the state of defects in a gate 126g of a reference column switch transistor 126 according to a prior art.

Assume that at the OTP 100 having such a circuit configuration as shown in FIG. 1, each wiring or Via (Via: connection region that electrically couples an upper layer wiring and a lower layer wiring in a multilayered interconnection or wiring) is high in resistance or broken.

Figure 8A:
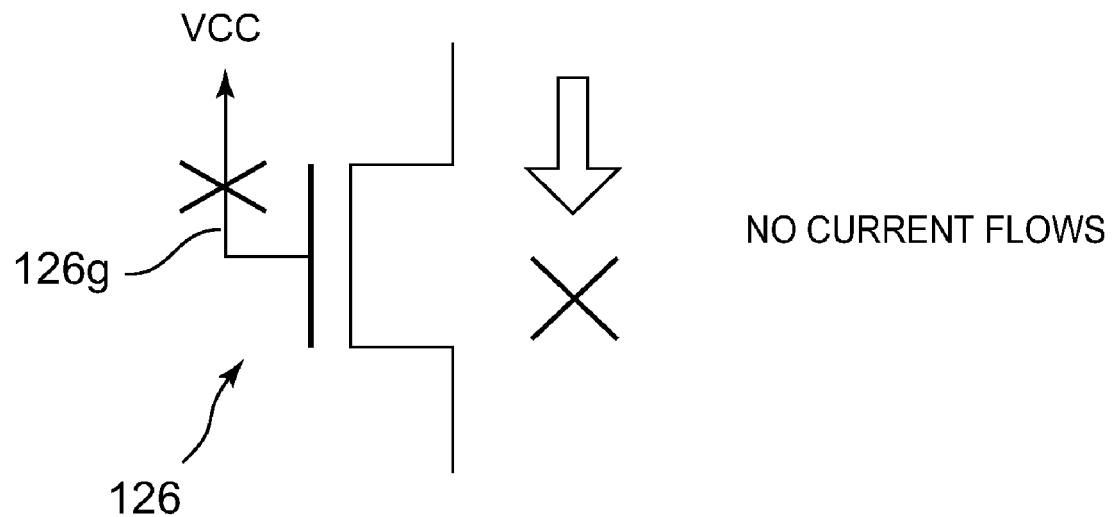
FIG. 8 shows the state of defects in the gate of a reference column switch transistor according to the prior art.

In such a case, FIG. 8A shows the state of the reference column switch transistor 126 corresponding to a normally ON transistor just after the supply of power. With the high resistance or breaking of the wiring or Via at this time, the gate level is not subjected to the voltage application and no current flows into the transistor.

Figure 8B:
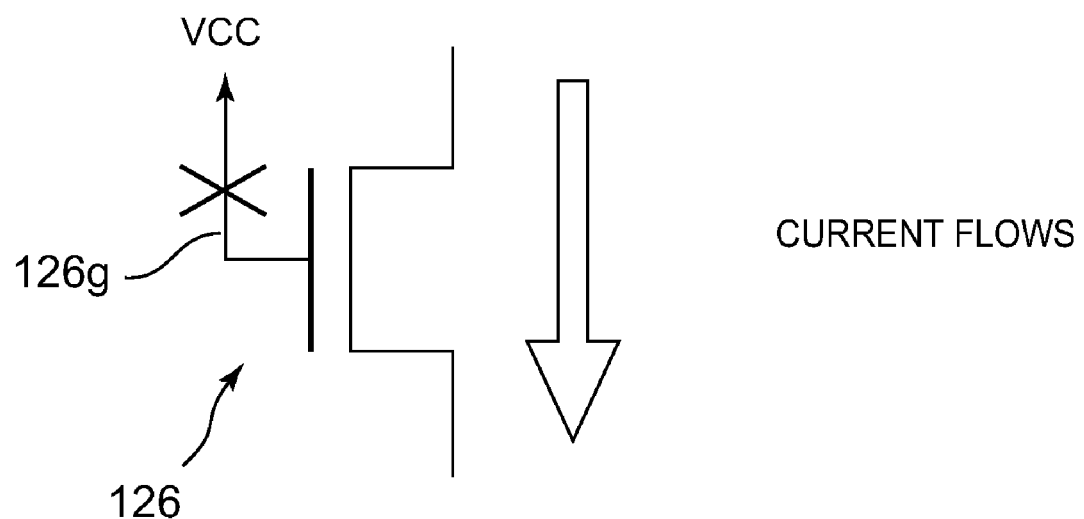

FIG. 8B shows the state of the reference column switch transistor 126 corresponding to the normally ON transistor at the time that it is left for a while the supply of power remains held. Since, at this time, the gate level is charged with the elapse of time after the power supply although the high resistance or breaking of the wiring or Via exists, the transistor is brought to an ON state so that the current flows into the transistor.

Therefore, there is a possibility that when testing is done in the test processes 600 and 700 according to the prior art in FIGS. 6 and 7, the gate 126g of the reference column switch transistor 126 corresponding to the normally ON transistor, which gate is directly coupled to the source, is charged until the FC tests 630 and 730 are carried out, so that the current will flow therethrough without causing its failure.

The operation of the first preferred embodiment of the invention of the present application will be explained below.

FIG. 2 shows a first flowchart 200 for inspecting a wafer level OTP 100 according to the first preferred embodiment of the invention of the present application. Incidentally, the inspection of the OTP 100 by the first flowchart 200 indicates where the wafer level OTP 100 is tested using a probe card.

At Step 210, a contact test is conducted. Described in detail, a contact test as to whether a probe or inspection needle corresponding to an inspection terminal of the probe card connected (mounted) to the inspection terminal of the LSI tester, and its corresponding pad of the wafer level OTP 100 corresponding to an inspected object (device) mounted to the mounting portion of the LSI tester are in contact.

At Step 220, a DC test is done. Described in detail, the wafer level OTP 100 is supplied with power from the LSI tester via the probe card to perform the DC test of the OTP 100, whereby the DC characteristic of the OTP 100 is measured.

At Step 230, an FC test is conducted. Described in detail, the conventional FC test (test similar to the FC test of Step 630 in FIG. 6) is carried out. A "1" reading test in an initial state of Step 230a, "0" writing at fixed pattern data of Step 230b, and a "0" and "1" reading test at fixed pattern data of Step 230c are executed. Incidentally, the reason why the "1" reading test is done again at Step 230c, is the same as when the conventional FC tests 630c and 730b in FIGS. 6 and 7 are performed. At Steps 230a, 230b and 230c, "0" or "1" of the normal cell transistor 114 is determined by making a comparison between a detector output DO of each normal cell and a reference detector output RDO of a reference cell, and the "1" reading test, "0" writing and "0" and "1" reading test are conducted. A method for its comparison is determined based on a voltage value of the detector output DO—the reference detector output RDO. Further, the normal cell transistor 114, the column switch transistor 124 of the column switch group 120, and the detector 130 all of which are shown in FIG. 1, are generically called "normal cell". The reference cell transistor 116, the column switch transistor 126 of the column switch group 120, and the reference detector 140 are generically referred to as each reference cell.

At Step 240, the power is turned OFF. Described in detail, the power supplied from the corresponding inspection or testing equipment to the OTP 100 is cut off or shut down here to free the electric charge of the gate 126g of the reference column switch transistor 126, which might have been charged.

At Step 250, the power OFF is maintained for a predetermined time. Described in detail, the power is turned OFF for about a few minutes (specifically, a time interval ranging from about 5 minutes to about 10 minutes) to free the electric charge accumulated in the gate 126g of the reference column switch transistor 126 as described at Step 240.

At Step 260, a contact test is carried out. Described in detail, it performs exactly the same operation as Step 210. Incidentally, here, the execution of the contact test is done because there is a possibility that since the power has been supplied for a long time on the FC test of Step 230 and the transfer of data between the LSI tester and the OTP 100 has been performed, heat would have been generated in the inspection needle of the probe card or each pad of the OTP 100. Therefore, since there is a case where the inspection needle or pad is shrunk from its thermally-expanded state and detached from contact (there is a possibility that the contact test will not be allowed to pass) when the power is turned OFF for a predetermined time after the completion of the FC test of Step 230, the contact test is performed again.

At Step 270, the power is turned ON. Described in detail, the power is supplied to carry out tests subsequent to Step 280.

At Step 280, an FC test on a cell corresponding to one bit is executed. Described in detail, a "0" reading test on the one-bit cell at Step 280a is carried out. And so, reference cells of more than at least one exist in the selection WL 112, and a plurality of normal cells are respectively connected thereto in association with one another. When, for example, one reference cell that exists in the selection WL 112 is connected to a predetermined number of normal cells, any one of the normal cells and its corresponding reference cell are compared and the "0" reading test is conducted. This is represented as the "0" reading test of the one-bit cell being conducted. A decision as to whether the reference cell is good or bad is made by conducting at least one function test, based on the function test of each normal cell. Of the normal cells corresponding to the respective reference cells, the "0" reading test is conducted on all the reference cells one by one by the reference cells.

It is determined at Step 280 whether the OTP 100 is good or bad. Then, the test is ended and power is turned OFF.

Whether the reference cell is good or bad can be determined by the "0" reading test of Step 280a.

Thus, according to the first preferred embodiment of the invention of the present application, it is possible to screen the breaking of the gate of the reference column switch transistor 126 corresponding to the normally ON transistor or the detect or failure of the reference bit line 116b due to the high resistance.

FIG. 3 shows a second flowchart 300 for examining or inspecting the packaged OTP 100 according to the first preferred embodiment of the invention of the present application.

Incidentally, the inspection of the OTP 100 by the second flowchart 300 indicates where the packaged OTP 100 is tested using an inspecting board.

A contact test of Step 310 is of a test similar to the contact test of Step 210 of FIG. 2. Described in detail, there is a difference in that an object to be inspected or examined is of the wafer level OTP 100 at Step 210 of FIG. 2, and the object is of the packaged OTP 100 at Step 310 of FIG. 3. Thus, on the contact test of Step 310, the contact test is made as to whether an inspection terminal (IC socket) of the inspecting board connected (mounted) to its corresponding inspection terminal of the LSI tester, and a terminal of the OTP 100 (packaged IC) set to the IC socket of the inspecting board mounted to its corresponding mounting portion of the LSI tester are in contact with each other.

A DC test of Step 320 is of a DC test similar to the Step 220 of FIG. 2.

An FC test of Step 330 and the FC test of Step 230 of FIG. 2 are basically identical to each other. In the packaged OTP 100, however, user data is written at Step 330a, and whether the written user data is proper or correct is determined by a "0" and "1" reading test of Step 330b.

Power-OFF of Step 340 is of a process similar to Step 240 of FIG. 2.

Maintaining the power-OFF for a predetermined time at Step 350 is of a process similar to Step 250 of FIG. 2.

A contact test of Step 360 is of a test similar to the contact test of Step 310.

Power-ON of Step 370 is of a process similar to Step 270 of FIG. 2.

An FC test of Step 380 is of an FC test similar to the FC test of Step 280 in FIG. 2 (an FC test of Step 380a is also of an FC test similar to the FC test of Step 280a in FIG. 2).

It is determined at Step 380 whether the OTP 100 is good or bad. Then, the test is ended and power is cut off.

According to the first preferred embodiment of the invention of the present application, the decision as to whether the reference cell is good or bad is made by Step 380. Therefore, the defect of the reference bit line 116b due to the breaking or high resistance of the gate of the reference column switch transistor 126 corresponding to the normally ON transistor can be screened.

Incidentally, the time provided to turn off the power using such a method as to forcibly free the electric charge charged into the gate of the reference column switch transistor 126 corresponding to the normally ON transistor in a short period of time may be shortened.

Second Preferred Embodiment

The operation of a second preferred embodiment of the invention of the present application will be described below.

FIG. 4 shows a third flowchart 400 for inspecting a wafer level OTP 100 according to the second preferred embodiment of the invention of the present application.

FIG. 4 illustrative of the third flowchart 400 for inspecting the OTP 100 according to the second preferred embodiment of the invention of the present application is of a screening method applied where such a defect as described in FIG. 8 exists in the reference bit line 116b.

An inspection process is divided broadly into a contact test of Step 410, an FC test of Step 420 and a DC test of Step 430.

The FC test of Step 420 consists of two process steps of an FC test of Step 440 and an FC test of Step 450.

Described in detail, the FC test of Step 440 comprises three process steps of an FC test of Step 440a, an FC test of Step 440b and an FC test of Step 440c. The FC test of Step 450 consists of three process steps of an FC test of Step 450*a*, an FC test of Step 450*b* and an FC test of Step 450*c*.

At Step 410, the contact test is carried out. Described in detail, the contact test is similar to the process steps corresponding to Steps 210 and 260 in FIG. 2.

At Step 420, the FC test is performed. Described in detail, the FC test of Step 440 and the FC test of Step 450 are executed on the FC test of Step 420.

On the FC test of Step 440*a* in the FC test of Step 440, a "1" reading test in an initial state of each cell corresponding to one bit is carried out. Next, "0" writing of fixed pattern data of each cell corresponding to one bit is performed on the FC test of Step 440*b*. Finally, a "0" reading test on fixed pattern data of each cell corresponding to one bit is performed on the FC test of Step 440*c*.

For example, reference cells of more than at least one exist in a selection WL 112, and a plurality of normal cells are respectively connected thereto in association with one another. When one reference cell that exists in the selection WL 112 is connected to a predetermined number of normal cells, any one of the normal cells and its corresponding reference cell are compared and the "1" reading test is conducted. This is represented as the "1" reading test of the one-bit cell being conducted. "0" is written into any one of the normal cells, and the normal cell with "0" written therein and its corresponding reference cell are compared, whereby the "0" reading test is executed. This is represented as the "0" reading test of the cell corresponding to one bit being carried out. A decision as to whether the reference cell is good or bad is made by conducting at least one function test, based on the function test on each normal cell.

Incidentally, the process steps of the FC tests of Steps 440*a*, 440*b* and 440*c* are performed on all reference cells on the FC test of Step 440.

The FC test of Step 450 is carried out. On the FC test of Step 450*a*, the "1" reading test in the initial state is performed on all remaining normal cells other than on the FC test of Step 440. Next, on the FC test of Step 450*b*, the "0" writing of the fixed pattern data is performed on all remaining normal cells other than on the FC test of Step 440. Finally, the "0" and "1" reading test of the fixed pattern data is conducted on all remaining normal cells other than on the FC test of Step 440. Incidentally, the fixed pattern data are used as the data of "0" and "1" on the FC test of Step 450.

At Step 430, the DC test is performed. Described in detail, it is executed after the completion of the six process steps (Steps 440*a*, 440*b*, 440*c*, 450*a*, 450*b* and 450*c*) contained in the FC test of Step 420.

Thus, according to the second preferred embodiment of the invention of the present application, the time taken from the supply of power to the start of the "0" reading test of the fixed pattern data of the one-bit cell at Step 440*c* can be shortened, and the defect of the reference bit line can be screened.

FIG. 5 shows a fourth flowchart 500 for inspecting the packaged OTP 100 according to the second preferred embodiment of the invention of the present application. Incidentally, the inspection of the OTP 100 by the fourth flowchart 500 indicates where the packaged OTP 100 is tested using an inspecting board.

A contact test of Step 510 is of a test similar to the contact test of Step 410 of FIG. 4. Described in detail, there is a difference in that an object to be inspected or examined is of the wafer level OTP 100 at Step 410 of FIG. 4, and the object is of the packaged OTP 100 at Step 510 of FIG. 5. Thus, on the contact test of Step 510, the contact test is made as to whether an IC socket mounted to the inspecting board connected (mounted) to its corresponding inspection terminal of the LSI tester, and a terminal of the OTP 100 (packaged IC) set to the IC socket of the inspecting board mounted to its corresponding mounting portion of the LSI tester are in contact with each other.

An FC test of Step 520 and the FC test of Step 420 of FIG. 4 are basically identical to each other. Upon inspection of the packaged OTP 100, however, the FC test of Step 520 consists of an FC test of Step 540 and an FC test of Step 550.

The FC test of Step 540 comprises Steps 540*a* and 540*b*. At Step 540*a*, "0" of each cell corresponding to one bit in user data is written, and whether a reference cell is good or bad is determined by a "0" reading test of each cell corresponding to one bit at Step 540*b*.

The FC test of Step 550 comprises Steps 550*a* and 550*b*. At Step 550*a*, "0" writing of remaining cells in the user data is performed. Described in detail, "0" writing of all data in user data other than those written at Step 540*a* is performed on all remaining normal cells other than those subjected to the end of the test. At Step 550*b*, it is determined by a "0" and "1" reading test whether the user data written at Step 550*a* is proper or correct.

Incidentally, the FC-test process step at Step 540*b* is performed on all reference cells on the FC test of Step 540.

A DC test of Step 530 is of a DC test similar to Step 430 of FIG. 4.

Incidentally, according to the second preferred embodiment of the invention of the present application, a decision made as to whether the operation of each reference cell is good or not, by performing at least one function test, based on the function test, is performed preferentially.

According to the second preferred embodiment of the invention of the present application, the time taken from the supply of power to the start of the "0" reading test of each cell corresponding to one bit at Step 540*b* is shortened, and the defect of the reference bit line can be screened.

The reason why the defect of the reference bit line can be screened will be explained below.

Immediately after the supply of power as described using FIG. 8, the gate level of the reference column switch transistor 126 is not charged and hence no reference cell current Iref flows through the reference bit line 116*b*.

If the normal cell transistor 114 is "1" (in the blank state) in this case as described in the prior art, then the difference in output voltage between the detector 130 and the reference detector 140 becomes DO−RDO=Ra(VCC/(Ra+Rb)+Icell)−Ra(VCC/(Ra+Rb)+Iref/2)=Ra×Iref>0. Thus, the reading test is brought to PASS. If, however, the normal cell transistor 114 is "0" (in the write state), then the difference in output voltage between the detector 130 and the reference detector 140 assumes DO−RDO=Ra(VCC/(Ra+Rb)+Icell)−Ra(VCC/(Ra+Rb)+Iref/2)=0 and hence the reading test is brought to FAIL.

From the above viewpoint, the defect of the reference bit line 116*b* due to the breaking or high resistance of the gate 126*g* of the reference column switch transistor 126 cannot be detected on the reading test. This defect can be detected on the "0" reading test ("0" reading test of each cell corresponding to one bit at Steps 440*c* and 540*b*).

In order to enhance the rate of screening detection of the defect of the reference bit line 116*b* in light of the above, there is a need to shorten the time taken from the supply of power to the start of the "0" reading test of each cell corresponding to one bit at Steps 440*c* and 540*b* as shown in FIGS. 4 and 5.

Therefore, the DC tests of Steps 430 and 530 are performed after the FC tests of Steps 420 and 520. Further, in order to avoid the spending of much time, the "0" writing ("0" writing of the cell corresponding to one bit in the user data at Step 540*a*) of the cell corresponding to one bit at Step 440*b* is performed, and the "0" reading test of the cell corresponding to one bit at Steps 440*c* and 540*b* is carried out.

Incidentally, the reason why the above defect of reference bit line 116 can be screened by the test using only the cell (for each one of the normal cells corresponding to all reference cells) corresponding to one bit is that the reference column switch transistor 126 shown in FIG. 1 is normally held ON without depending on the column address and row address (selection WL 112) and becomes defective even though any address is selected.

Thus, according to the second preferred embodiment of the invention of the present application, the "1" reading test of each cell corresponding to one bit at Step 440a is first performed on the memory cell array 110, and the "0" writing of each cell corresponding to one bit at Step 440b and the "0" reading test of each cell corresponding to one bit at Step 440c are performed on the memory cell array 110, thereby making it possible to significantly shorten the time taken from the supply of power to the start of the "0" reading test of the cell corresponding to one bit at Step 440c. Further, the "0" writing of each cell corresponding to one bit in the user data at Step 540a is first performed on the memory cell array 110, and the "0" reading test of each cell corresponding to one bit at Step 540b is performed thereon, thereby making it possible to significantly shorten the time taken from the supply of power to the start of the "0" reading test of each cell corresponding to one bit at Step 540b. As a result, the defect of the reference bit line 116b due to the breaking or high resistance of the gate 126g of the reference column switch transistor 126 corresponding to the normally ON transistor can be screened.

While the preferred forms of the present invention have been described, it is to be understood that modifications will be apparent to those skilled in the art without departing from the spirit of the invention. The scope of the invention is to be determined solely by the following claims.

What is claimed is:

1. A method for testing an operating state of a semiconductor device using a semiconductor testing apparatus to mount the semiconductor device to a mounting portion, the semiconductor device having a plurality of normal cells, each having a memory function for accumulating an electric charge by a floating gate thereof and a control gate thereof thereby to store information, and at least one reference cell identical in structure and function to each of the normal cells and taken as a reference object for an operating state of the normal cell, wherein the semiconductor device further includes a reference column switch connected to the at least one reference cell by a bit line and to a power supply line, the method comprising:
    operating each of the normal cells as an object on a pseudo basis to perform a function test on a normal corresponding cell with the reference cell as a reference; and
    controlling a supply of power to the semiconductor device and to the reference column switch such that, after the completion of execution of the function test, the supply of power thereof from the mounting portion to the device is stopped and the power is supplied again after a predetermined time,
    wherein the function test performs at least one function test after the resupply of power thereby to determine whether the operation of the reference cell is good.

2. The method for semiconductor testing an operating state of a semiconductor device according to claim 1, wherein the normal cells are classified into plural sets and one said reference cell is provided for each set, and the function test is performed on the corresponding cell for every set.

3. A method for testing an operating state of a semiconductor device using a semiconductor testing apparatus to mount the semiconductor device to a mounting portion, the semiconductor device having a plurality of normal cells, each including a memory function for accumulating an electric charge by a floating gate thereof and a control gate thereof thereby to store information, and at least one reference cell identical in structure and function to each of the normal cells and taken as a reference object for an operating state of the normal cell, wherein the semiconductor device further includes a reference column switch connected to the at least one reference cell by a bit line and to a power supply line, the method comprising:
    performing a contact test to determine electrical conduction between the mounting portion and pads or terminals of the device on all of the pads or terminals;
    performing a dc test to inspect a state of a direct current characteristic at an input/output of the device on all the cells;
    operating each of the normal cells as an object on a pseudo basis to perform a function test on a corresponding cell with the reference cell as a reference; and
    controlling a supply of power such that after the completion of execution of the contact test, the dc test and the function test, the supply thereof from the mounting portion to the semiconductor device and to the reference column switch is stopped and the power is supplied again after a predetermined time,
    wherein the function test is performed at least one function test after the resupply of power thereby to determine whether the operation of the reference cell is good.

4. The method for semiconductor testing according to claim 3, wherein the normal cells are classified into plural sets and one said reference cell is provided for each set, and the function test is performed on the corresponding cell for every set.

5. The method for semiconductor testing according to claim 3, wherein the contact test is executed after the elapse of the predetermined time and before the resupply of the power.

6. The method for semiconductor testing according to claim 4, wherein the contact test is executed after the elapse of the predetermined time and before the resupply of the power.

7. A method for testing for a semiconductor device using a semiconductor testing apparatus to mount the semiconductor device to a mounting portion, the semiconductor device having a plurality of normal cells, each having a memory function for accumulating an electric charge by a floating gate thereof and a control gate thereof thereby to store information, and at least one reference cell identical in structure and function to each of the normal cells and taken as a reference object for an operating state of the normal cell, wherein the semiconductor device further includes a reference column switch connected to the at least one reference cell by a bit line and to a power supply line, the method comprising:
    operating each of the normal cells as an object on a pseudo basis to perform a function test on a corresponding cell with the reference cell as a reference,
    wherein the function test performs a decision as to whether the operation of the reference cell is good, by conducting at least one said function test,
    the function test including:
        providing power supply to the semiconductor device and to the reference column switch,
        "0" writing of cell corresponding to one bit,
        "0" reading of test cell corresponding to one bit,
        '0' writing of remaining cells,
        and "0" and "1" reading test on remaining cells, and
        cutting the power supply off.

8. The method for testing for a semiconductor device of claim 7, wherein the function test further includes:
    "1" reading test on cell corresponding to one bit, and
    "1" reading test on remaining cells.

* * * * *